US005698113A

United States Patent [19]

Baker et al.

[11] Patent Number: 5,698,113
[45] Date of Patent: Dec. 16, 1997

[54] RECOVERY OF MO/SI MULTILAYER COATED OPTICAL SUBSTRATES

[75] Inventors: Sherry L. Baker; Stephen P. Vernon, both of Pleasanton; Daniel G. Stearns, Los Altos, all of Calif.

[73] Assignee: The Regents of the University of California, Oakland, Calif.

[21] Appl. No.: 607,055

[22] Filed: Feb. 22, 1996

[51] Int. Cl.$^6$ .................................................. C23C 14/58
[52] U.S. Cl. .................... 216/72; 216/67; 216/75; 216/79; 427/534; 427/535
[58] Field of Search .................... 216/24, 63, 67, 216/72, 74, 75, 79, 80; 427/534, 535, 537, 163.4, 164, 165

[56] References Cited

U.S. PATENT DOCUMENTS

| 3,518,134 | 6/1970 | Preist | 216/75 |
|---|---|---|---|
| 3,951,709 | 4/1976 | Jacob | 216/75 |
| 4,348,577 | 9/1982 | Toyoda et al. | 216/67 |
| 4,975,146 | 12/1990 | Knapp et al. | 216/75 |
| 5,007,981 | 4/1991 | Kawasaki et al. | 216/63 |
| 5,259,923 | 11/1993 | Hori et al. | 216/67 |
| 5,356,662 | 10/1994 | Early et al. | 427/140 |

OTHER PUBLICATIONS

Tennant, D.M. et al "Comparison of reflective mask technologies for soft x-ray projection lithography" Proc. SPIE-–Int. Soc>Opt.Eng. vol. 1604, pp. 91–104 (abstract only), 1992.

Ito, M. et al "Soft x-ray projection imaging with multilayer reflection masks" Microelectronic Engr. vol.27, pp. 285–290, 1995.

Malek, C. K. et al "Application of e-beam lithography and reactive ion etching to the fabrication of masks for projection x-ray lithography" J. Vac. Sci. Technol. B. vol. 9, #6, pp. 3315–3318, Nov. 1991.

Primary Examiner—R. Bruce Breneman
Assistant Examiner—Anita Alanko
Attorney, Agent, or Firm—Henry P. Sartorio; John P. Wooldridge

[57] ABSTRACT

Mo/Si multilayers are removed from superpolished ZERO-DUR and fused silica substrates with a dry etching process that, under suitable processing conditions, produces negligible change in either the substrate surface figure or surface roughness. The two step dry etching process removes $SiO_2$ overlayer with a fluroine-containing gas and then moves molybdenum and silicon multilayers with a chlorine-containing gas. Full recovery of the initial normal incidence extreme ultra-violet (EUV) reflectance response has been demonstrated on reprocessed substrates.

8 Claims, 3 Drawing Sheets

RECOVERY OF MO/SI MULTILAYER COATED OPTICAL SUBSTRATES

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to the recovery of substrates for use in EUVL systems and more specifically, it relates to a dry etching process for the removal of Mo/Si ML reflective coatings from super polished optical substrates with little or no modification to substrate figure or finish.

2. Description of Related Art

The imaging optics in an extreme ultra-violet lithography (EUVL) system consists of Mo/Si multilayer (ML) reflective coatings on super polished optical substrates. The precision optical components must meet stringent requirements and are expensive, costing in the range of 0.5–1.0 million dollars. Errors in the surface figure must be kept to less than 0.8 nm and the RMS surface roughness must be less than 0.1 nm. The specifications challenge the limits of current capabilities in optics fabrication and ML deposition. The required tolerances of the ML coatings are extremely tight and a failure in the ML deposition process will result in degraded imaging performance. Other likely failure modes involve deterioration of the ML coatings due to long term radiation dose effects, corrosion and surface contamination. Most mechanisms that degrade ML coatings leave the super polished substrates intact. Replacement costs would be minimized by recovering and recoating the super polished optical substrates. Consequently, there is a need to identify an effective process for removing the ML coatings without degrading the surface figure and finish of the precision substrates. Any roughening of the substrate surface or change in optical figure will adversely effect the performance of the imaging system and destroy the optic for EUVL purposes.

Previous attempts to remove Mo/Si MLs from super polished substrates have met with marginal success. Stearns et al studied dry etching of Mo/Si ML on both $SiO_2$ and ZERODUR substrates (a silica based glass ceramic) using reactive ion etching (RIE) in $SF_6$. The process has an etch rate selectivity of only ~20:1 for $SiO_2$, which is problematic when loading effects produce non uniform removal of the Mo/Si ML, resulting in figure modification. The ML-to-ZERODUR selectivity of >800 produced no observable figure modification. However, roughening did occur due to the difference in etch rates of ZERODUR'S two component matrix of $SiO_2$ and $Al_2O_3$.

Wet etching of Mo/Si MLs utilizing both potassium ferrocyanide/alkali hydroxide and hydrofluoric/nitric etchants has been reported. In both cases the etchant solutions had poor selectivity to the $SiO_2$ substrates and the authors were forced to resort to sputter depositing an etch resistant amorphous carbon ($\alpha C$) barrier layer between the substrate and the Mo/Si ML. Pinhole free $\alpha C$ films >100 nm thick were required to eliminate substrate attack; unfortunately, the surface roughness of the $\alpha C$ barrier layer increases with film thickness and reduces the Mo/Si ML EUV reflectance. Reactive ion etching (RIE) of Mo/Si ML using an $SF_6$ plasma has been studied for both $SiO_2$ and ZERODUR substrates. The process has an etch rate selectivity of only ~20:1 for $SiO_2$ which is problematic when loading effects produce non-uniform removal of the Mo/Si ML, but in the most favorable case a 95% recovery of the initial EUV reflectance was demonstrated. For ZERODUR no figure modification was observed, but only 40% of the initial soft x-ray reflectance was recovered indicating significant roughening of the substrate. The roughening was attributed to the differential etch rates of ZERODUR'S multi-component matrix.

SUMMARY OF THE INVENTION

It is an object of the present invention to provide a two stage RIE process for Mo/Si ML removal that permits full recovery of the initial EUV reflectance of super polished optical substrates (including both ZERODUR and $SiO_2$ substrates) with little or no modification to substrate figure or finish.

The invention is a method for the removal of high reflectance Mo/Si ML coatings from superpolished EUV substrates which permits substrate re utilization and the full recovery of the initial EUV reflectance of the ML coated optic. The coatings are removed in a two step dry etching process: the discharge products of fluorine containing gases are used to remove the $SiO_2$ overlayer, subsequently, discharge products of chlorine containing gases are used to selectively remove the Mo and Si layers in addition to the Mo/Si interlayers The method is successful for both ZERODUR and fused silica substrates. The process produces no detectable modification to the surface figure; however, the substrate surface roughness is increased for substrates subjected to the reactive environment for excessive periods. The method offers significant process latitude in that an eight fold over etch on $SiO_2$ substrates still enabled 80% recovery of the initial normal incidence reflectance. The technique has been successfully used to recover highly curved spherical surrogate optics utilized in calibration of the ML deposition process for the Lawrence Livermore National Laboratory (LLNL) front-end test bed imaging system. Extensions of the technique to the recovery of precisely figured EUVL substrates are in progress.

DETAILED DESCRIPTION OF THE INVENTION

Figure 1:
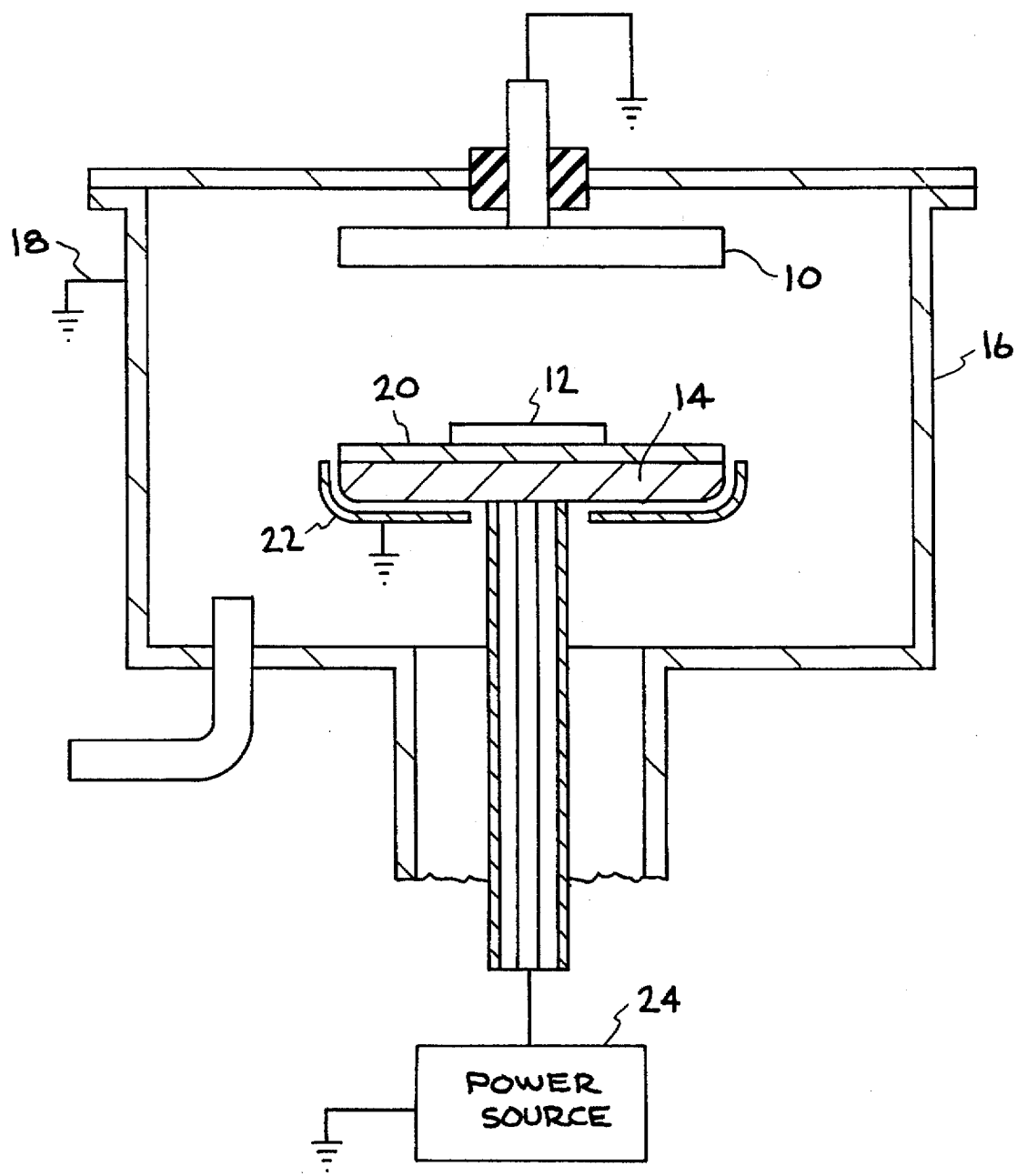
FIG. 1 shows a reactive ion etch configuration.

The invention is a dry etching process for the removal of Mo/Si ML reflective coatings from super polished ZERODUR and fused silica optical substrates with little or no modification to substrate figure or finish. Mo/Si ML coatings are removed from optical substrates utilizing a chlorine reactive ion etch (RIE). The RIE is performed using an rf diode configuration, as shown in FIG. 1. In one embodiment, the upper electrode 10 is grounded and the substrate 12 is placed on the powered electrode 14 within a chamber 16 which may comprise stainless steel that is electrically grounded at 18. Substrate 12 may be placed on a target plate 20. The gas pressure is 15 mt at a flow rate of 40 sccm. The rf power is 10 W at 13.56 MHz and a substrate bias voltage of less than 70 V. The rf electrode 14 may include a guard ring 22. Power to the rf electrode 14 is supplied from an rf source 24. The lower power conditions such as described in this embodiment minimize the sputtering effects of ion bombardment while allowing soft ion bombardment to enhance the reaction between neutrals and the material to be etched. The top layer of the ML stack is Si. It is necessary to remove the native silicon oxide layer on the substrate 12 prior to etching the Mo/Si ML. The coatings are removed in a two step dry etching process: the discharge products of fluorine containing gases including but not restricted to $SF_6$, $CHF_3$, etc. are used to remove the $SiO_2$ overlayer, subsequently, discharge products of chlorine containing gases including but not restricted to $Cl_2$, $BCl_3$, $CCl_4$, etc. are used to selectively remove the Mo and Si layers in addition to the Mo/Si interlayers. The recovery of precision optical substrates requires high selectivity of the Mo/Si etch to the substrate material as well as minimal ion bombardment of the substrate. This may be accomplished in any dry etching system that permits exposure of the $SiO_2$ and Mo/Si to reactive F and reactive Cl respectively with low power and little or no substrate bias.

The invention may be described generally as a two step dry etching process for the removal of Mo/Si multilayer reflective coatings from super polished ZERODUR and fused silica optical substrates. The process is carried out in a chamber that has a reactive ion etch configuration with a grounded RF electrode and a non-grounded RF electrode, where the substrate is placed on the non-grounded RF electrode. The first step of the process, the $SiO_2$ overlayer is removed by flowing fluorine gas through the chamber, where the gas is flowed at a flow rate within the range of 1 and 100 sccm and is at a pressure within the range of 1 and 100 mTorr. A bias voltage and radio frequency are then applied between the electrodes, where the bias voltage is within the range of 0 and 100 volts and the radio frequency is at a power within the range of 1 and 40 Watts. The radio frequency is at a frequency within the range of 1 and 100 MHz. This first step is carried out for a time period within the range of 1 and 10 minutes. In the second step, the Mo and Si layers are removed by flowing chlorine gas through the chamber, where the gas is flowed at a flow rate within the range of 1 and 100 sccm and is at a pressure within the range of 1 and 100 mTorr. A bias voltage and radio frequency are then applied between the electrodes, where the bias voltage is within the range of 0 and 100 Volts, the radio frequency is at a power within the range of 1 and 40 Watts, and where the radio frequency is at a frequency within the range of 1 and 100 MHz. This second step is carried out for a time period within the range of 1 and 200 minutes.

A series of measurements were performed to quantify changes in surface figure, surface roughness and normal incidence reflectance (NIR) produced by RIE removal of Mo/Si MLs from superpolished fused silica and ZERODUR optical flats. Substrates were 1" diameter by 0.25" thick and flat to $\lambda/10$, at 633 nm, with a surface roughness of <1 Å RMS, as determined by optical methods. The following experimental protocols and procedures were employed: First, the substrate surface profile was measured using an optical heterodyne interferometer. Subsequently, N=40 1/2 bilayer Mo/Si ML coatings (the Si layer is uppermost) with ML periods of $\Lambda \approx 70$ Å were deposited using dc magnetron sputter deposition in an Ar plasma. The ML coatings were removed with a two stage RIE process in an rf diode configuration with the substrate located on the powered electrode. Complete removal of the ML coating required 25 minute etch times. In order to quantify the process latitude associated with RIE removal of Mo/Si MLs, etching experiments were conducted with durations between 25 and 200 minutes.

The surface profile of the etched specimens was measured using the same optical heterodyne interferometer. The change in surface figure resulting from deposition and removal of the MLs was determined by comparing the measured surface profiles of the pre and post etched substrates. Atomic force microscopy was used to measure the RMS surface roughness of selected specimens derived from the areal power spectral density (PSD) of surface height variations over the spatial frequency region between 1 and 1000 $\mu m^{-1}$. Following these measurements, the substrates received new Mo/Si ML coatings with the same characteristics describe above, i.e. $N=40^{1/2}$ and $\Lambda \approx 70$ Å. For comparison purposes an unprocessed control specimen was coated in each magnetron sputter deposition process. The normal incidence EUV reflectance of all specimens was measured and compared to that of the control sample.

Mo/Si ML coatings react with atmospheric gases. The temporal stability of the EUV reflectance of ML coatings with Si uppermost is greatest, and this is the favored design for EUV MLs operating at 13 nm. High performance near-normal incidence EUVL optical elements properly consist of a substrate, a Mo/Si ML and an overlayer of $SiO_2$ formed in the oxidation of the uppermost Si layer upon exposure to the atmosphere. The Mo/Si ML was removed in a chlorine RIE, typical process parameters were 10 Watts of rf power at 13.56 MHz, at a pressure of 15 mTorr and gas flow rates of order 50 sccm. However, the surface oxide is resistant to the chlorine etch, and ML removal will not occur unless the surface oxide has been stripped in a separate process. A three minute RIE process using $SF_6$, at 15 mTorr and 40 sccm with 10 Watts of rf power at 13.56 MHz effectively cut the surface oxide. With the surface oxide removed, the time required to completely remove the ML coating is of order 20 minutes; this corresponds to a Mo/Si etching rate of order 10 m/min.

Figure 2A:
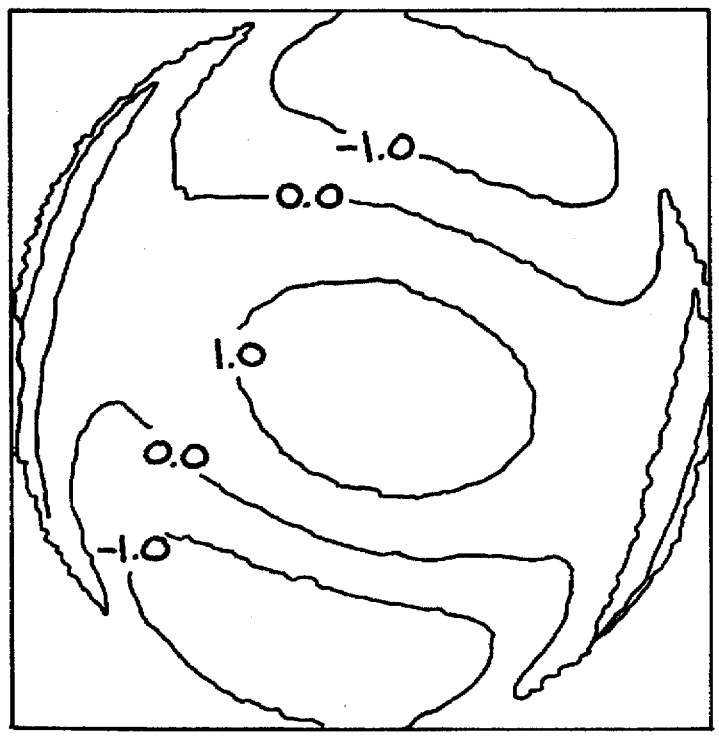
FIG. 2A shows the surface figure of a ZERODUR optic after a 200 minute Cl etch.
Figure 2B:
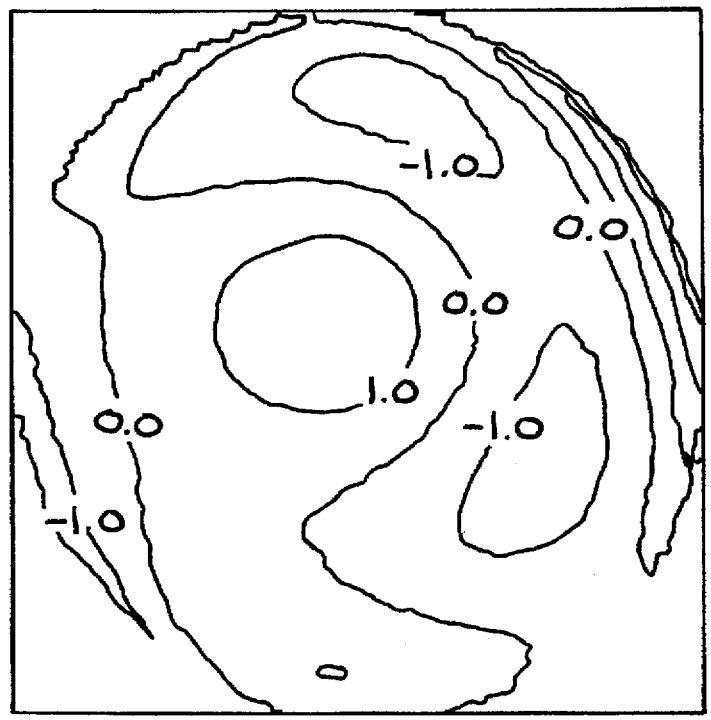
FIG. 2B shows the surface figure of a fused silica optic after a 200 minute Cl etch.

The surface height variation after a 200 minute chlorine RIE process for both ZERODUR and $SiO_2$ substrates is illustrated in FIGS. 2A and 2B. Difference curves were calculated from a Zernike polynomial analysis of the measured surface height distributions of the pre- and post-etched substrates correct to $16^{th}$ order. The measurements were made over a 20 mm diameter clear aperture centered on the 25 mm diameter substrates. Within the measurement accuracy (3 nm), the chlorine RIE process produces no detectable change in the surface figure of either substrate material.

Figure 3:
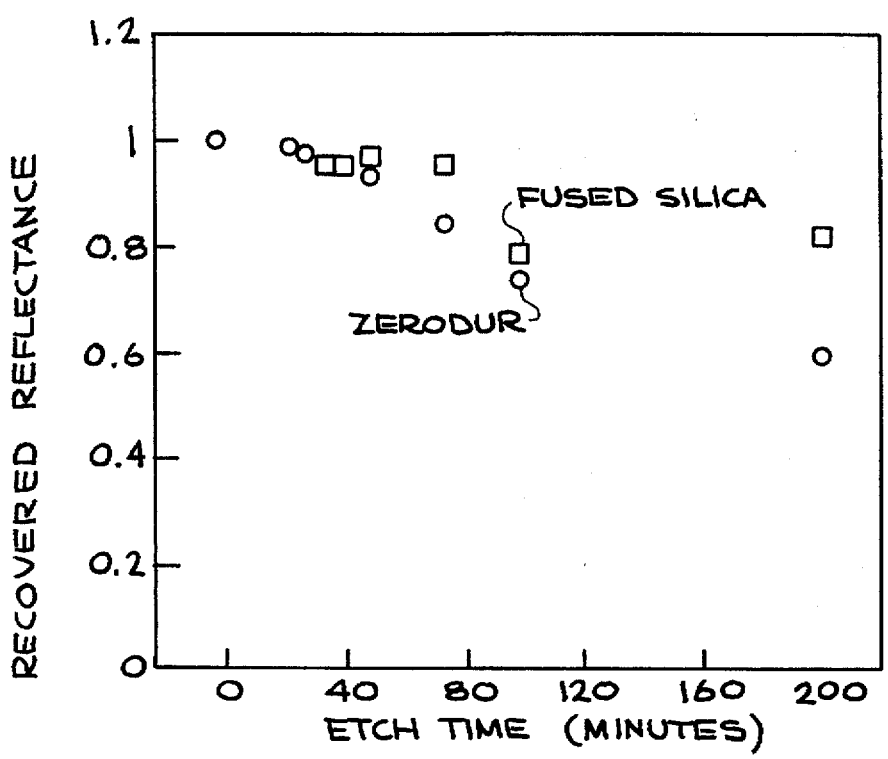
FIG. 3 shows recovered normal incidence reflectance vs. etch time.

Measurement of the EUV normal incidence reflectance of the recoated substrates provides a more detailed probe of the substrate surface condition. In FIG. 3 the recovered reflectance is illustrated vs. etching time for both fused silica and zerodur substrates. In each case, the reflectance has been normalized to the measured NIR of the control sample. The recoated substrates exhibit a gradual degradation in reflectance with increased etch time which is more severe for ZERODUR than fused silica. For the longest etching times recoated ZERODUR substrates exhibit approximately twice the reflectivity loss of fused silica substrates; however, for the longest etching time investigated (200 minutes), this corresponds to 60% recovery of the initial NIR. For $SiO_2$, worst case behavior corresponds to greater than 80% recovery of the initial NIR. Note that a 200 minute etch corresponds to an eight-fold increase in the time required to completely remove the ML. For shorter processing times $\leq 50$ minutes >95% of the initial reflectance is recovered for both substrate materials.

Figure 4:
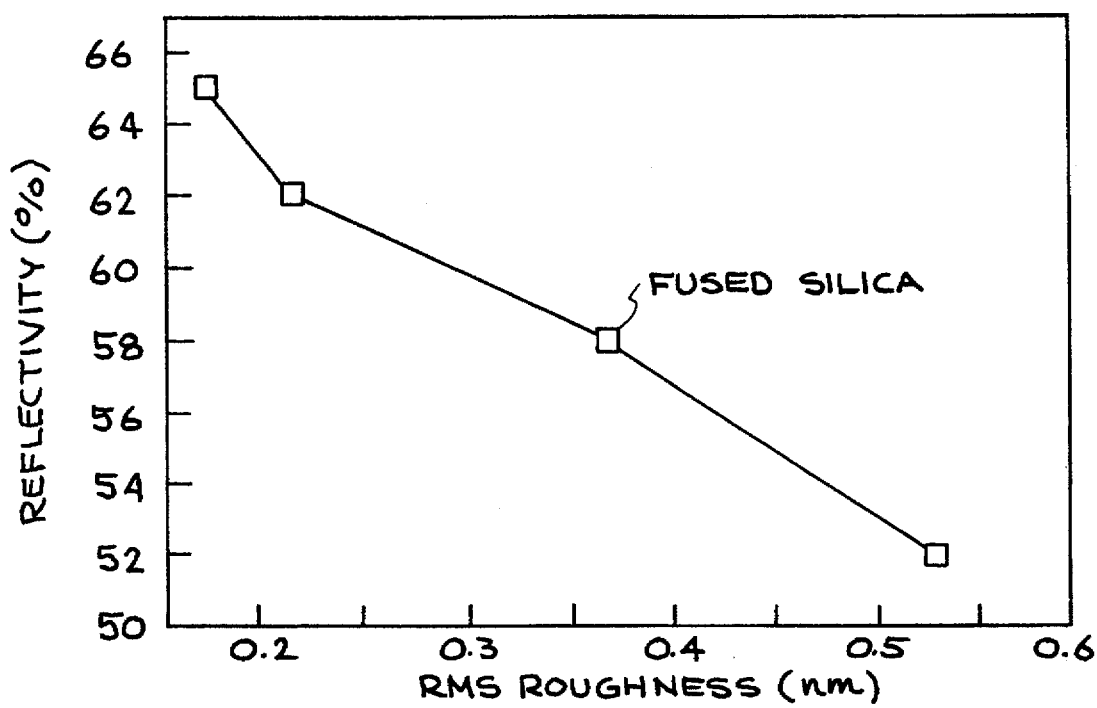
FIG. 4 shows reflectance vs. substrate surface roughness for $SiO_2$ substrates.

FIG. 4 illustrates the relationship between ML reflectance and substrate surface finish as derived from scanning probe microscopy measurements of RIE processed $SiO_2$ optical flats. The variation in substrate surface condition was produced by altering the duration of the chlorine etch. The reflectance decreases from a maximum of 65%, typical of high reflectance Mo/Si ML coatings on superpolished optical flats, to 50% as the substrate surface roughness increases from 0.1 to 0.55 nm.

Changes and modifications in the specifically described embodiments can be carried out without departing from the scope of the invention, which is intended to be limited by the scope of the appended claims.

We claim:

1. A two step dry etching process for the removal of Mo/Si multilayer reflective coatings from super polished optical substrates, wherein said process is carried out in a chamber having a reactive ion etch configuration comprising a grounded RF electrode and a non-grounded RF electrode, wherein the substrate is placed on said non-grounded RF electrode, the first step comprising removing said $SiO_2$ overlayer by:
flowing a first gas comprising fluorine through said chamber, wherein said first gas is flowed at a first flow rate within the range of 1 and 100 sccm and wherein said first gas is at a first pressure within the range of 1 and 100 mTorr; and
applying a first bias voltage and a first radio frequency between the electrodes, wherein said first bias voltage is within the range of 0 and 100 volts, wherein said first radio frequency is at a power within the range of 1 and 40 Watts, and wherein said first radio frequency is at a frequency within the range of 1 and 100 MHz,
wherein said first step is carried out for a first time period within the range of 1 and 10 minutes; and the second step comprising removing the Mo and Si layers by:
flowing a second gas comprising chlorine through said chamber, wherein said second gas is flowed at a second flow rate within the range of 1 and 100 sccm and wherein said second gas is at a second pressure within the range of 1 and 100 mTorr; and
applying a second bias voltage and a second radio frequency between the electrodes, wherein said second bias voltage is within the range of 0 and 100 Volts, wherein said second radio frequency is at a second power within the range of 1 and 40 Watts, and wherein said second radio frequency is at a second frequency within the range of 1 and 100 MHz,
wherein said second step is carried out for a second time period within the range of 1 and 200 minutes.

2. The method of claim 1, wherein said super polished optical substrates are selected from a group consisting of a silica-based glass ceramic and fused silica.

3. The method of claim 1, wherein said first gas pressure and said second gas pressure comprise 15 mTorr at a flow rate of 40 sccm.

4. The method of claim 3, wherein said first rf power and said second rf power comprise 10 W.

5. The method of claim 4, wherein said first frequency and said second frequency comprise 13.56 MHz.

6. The method of claim 5, wherein said first substrate bias voltage and said second substrate bias voltage comprise less than 70 V.

7. The method of claim 1, wherein said first gas is selected from a group consisting of $SF_6$ and $CHF_3$.

8. The method of claim 1, wherein said second gas is selected from a group consisting of $Cl_2$, $BCl_3$ and $CCl_4$.

* * * * *